United States Patent
Babcock et al.

(10) Patent No.: US 8,703,568 B2
(45) Date of Patent: Apr. 22, 2014

(54) ADVANCED CMOS USING SUPER STEEP RETROGRADE WELLS

(75) Inventors: Jeffrey A. Babcock, Richardson, TX (US); Angelo Pinto, Allen, TX (US); Scott Balster, Dallas, TX (US); Alfred Haeusler, Freising (DE); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/359,125

(22) Filed: Jan. 26, 2012

(65) Prior Publication Data

US 2012/0164802 A1    Jun. 28, 2012

Related U.S. Application Data

(62) Division of application No. 13/006,224, filed on Jan. 13, 2011, now Pat. No. 8,129,246, which is a division of application No. 12/356,371, filed on Jan. 20, 2009, now Pat. No. 7,883,977, which is a division of application No. 11/380,602, filed on Apr. 27, 2006, now Pat. No. 7,501,324, which is a division of application No. 09/948,856, filed on Sep. 7, 2001, now Pat. No. 7,064,399.

(60) Provisional application No. 60/232,913, filed on Sep. 15, 2001.

(51) Int. Cl.
*H01L 21/336* (2006.01)

(52) U.S. Cl.
USPC .................................. 438/289; 257/E21.618

(58) Field of Classification Search
USPC ......... 438/282, 289, 291, 495, 510, 511, 527, 438/528; 257/345, 402, E21.147, E21.618
See application file for complete search history.

(56) References Cited

U.S. PATENT DOCUMENTS

| | | | |
|---|---|---|---|
| 5,514,902 A | 5/1996 | Kawasaki et al. | |
| 5,654,213 A | 8/1997 | Choi et al. | |
| 5,763,921 A | 6/1998 | Okumura et al. | |
| 6,043,139 A | 3/2000 | Eaglesham et al. | |
| 6,081,010 A | 6/2000 | Sanchez | |
| 6,268,640 B1 * | 7/2001 | Park et al. | 257/607 |
| 6,271,551 B1 * | 8/2001 | Schmitz et al. | 257/288 |
| 6,274,894 B1 | 8/2001 | Wieczorek et al. | |
| 6,310,366 B1 | 10/2001 | Rhodes et al. | |
| 6,426,279 B1 * | 7/2002 | Huster et al. | 438/528 |

* cited by examiner

*Primary Examiner* — David Vu
(74) *Attorney, Agent, or Firm* — Jacqueline J. Garner; Wade J. Brady, III; Frederick J. Telecky, Jr.

(57) ABSTRACT

The present invention is a method for forming super steep doping profiles in MOS transistor structures. The method comprises forming a carbon containing layer (110) beneath the gate dielectric (50) and source and drain regions (80) of a MOS transistor. The carbon containing layer (110) will prevent the diffusion of dopants into the region (40) directly beneath the gate dielectric layer (50).

3 Claims, 4 Drawing Sheets

ADVANCED CMOS USING SUPER STEEP RETROGRADE WELLS

This application is a divisional of and incorporates by reference application Ser. No. 13/006,224 filed Jan. 13, 2011, entitled "Advanced CMOS Using Super Steep Retrograde Wells", which claims the benefit of and incorporates Ser. No. 12/356,371 filed Jan. 20, 2009, entitled "Advanced CMOS Using Super Steep Retrograde Wells", which claims the benefit of and incorporates by reference application Ser. No. 11/380,602 filed Apr. 27, 2006, entitled "Advanced CMOS Using Super Steep Retrograde Wells", which claims the benefit of and incorporates by reference application Ser. No. 09/948,856 filed Sep. 7, 2001, entitled "Advanced CMOS Using Super Steep Retrograde Wells", which claims the benefit of and incorporates by reference U.S. provisional Application No. 60/232,913, filed Sep. 15, 2000, entitled "Advanced CMOS Using Super Steep Retrograde Wells".

FIELD OF THE INVENTION

The present invention relates to CMOS transistors formed using super steep retrograde wells. The method of formation of the retrograde well involves using a carbon doped capping layer. The method is applicable to both P-Well and N-Well formation by altering the diffusion characteristics of dopants such as B, P, In, and As for optimized retrograde well profile versus total thermal budget seen by these well during subsequent processing steeps.

BACKGROUND OF THE INVENTION

As advanced CMOS technology continues to scale and move into the deep-sub-micron geometry dimensions for core devices, proper channel engineering of the CMOS devices becomes increasingly important. One of the more promising methods for extending the performance of CMOS devices as technology continues to scale, is the incorporation of super steep retrograde wells and a thin intrinsic region for the channel of the CMOS devices. In forming a retrograde well the dopant concentration in regions further from the gate dielectric of the transistor is higher that that in regions adjacent to the transistor gate dielectric.

A typical MOS transistor is shown in FIG. 1. Isolation structures 20 are formed in the substrate 10. The gate dielectric layer 50, the conductive gate layer 60, and the sidewall structures 70 comprise the gate stack. In an enhancement mode transistor, the source and drain regions 80 are of an opposite conductivity type to that of the substrate region 10. As described above, in a retrograde well the dopant concentration in region 30 is greater than that of the channel region 40, with a concentration gradient that is typically limited by diffusion of the dopant species. In the ideal case what is required is a super steep dopant concentration profile from region 30 to region 40 with region 40 being intrinsically doped. The use of super steep retrograde wells with intrinsically doped channel regions has significant performance advantages for CMOS devices. These advantages include reduction of short channel effects, increased mobility in the channel region, higher mobility, less parasitic capacitance, and a reduction in short channel effects. Although the super steep retrograde wells have significant advantages for advanced CMOS devices, it is very difficult to achieve these structures when manufacturing these devices for high volume integrated circuit applications. This difficulty is due to the out-diffusion of the retrograde well dopant species into the channel region especially for p-well device such as the NMOS transistor. In fact, it has been shown that current silicon processing techniques will not be able to achieve stringent doping profiles that are targeted to change by as much as three orders of magnitude in less then 4 nm by the year 2008. There is therefore a great need for new processing techniques that will allow the formation of super steep retrograde well structures with near intrinsic transistor channel regions.

SUMMARY OF INVENTION

The improved MOS transistor of this type according to the present invention is characterized by the formation of carbon containing layers. The carbon containing layers will retard diffusion of the dopant species in the various regions of the MOS transistor. The methodology of the present invention offers many advantages over existing technology. The present invention allows for a higher thermal budget in forming the SSRW of advanced CMOS technology which increases dopant activation and hence reduces the "on state" resistance. It is now possible to simultaneously achieve ultra shallow vertical source drain junction conditions and a SSRW. Improved analog matching in individual NMOS and PMOS transistors can now be achieved since the fabrication process is now less sensitive to thermal variations during rapid thermal annealing across the wafer compared to processes that have faster diffusion rates and hence are less well controlled. The technique can be used to balance arsenic diffusion with boron diffusion for fabricating symmetric NMOS and PMOS devices in a typical CMOS process flow. It can also be used to make asymmetric source and drain structures by controlling carbon implantation in the source and drain regions. This may have benefits for making ESD and higher power devices in CMOS circuits. By using a mask to pattern the carbon (or SiGeC) implants it is possible to make a higher threshold and a low threshold voltage device while minimizing source drain implant diffusion in the vertical direction. The methodology allows boron to be extended into scaled deep submicron CMOS technologies, which have had to shift to indium dopants to achieve SSRW and ultra shallow junctions. Although indium works in these technologies it is non-standard for most CMOS processes and has a lower salability limit and is susceptible to carrier freeze out effects at room temperature which limits its usefulness. Other technical advantages will be readily apparent to one skilled in the art from the following FIGUREs, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

The invention will be described with reference to FIGS. 2-6. It comprises super steep retrograde well (SSRW) structures formed using a carbon based capping layer. In general the SSRW is very sensitive to diffusion of dopants and the total thermal budget that the SSRW encounters during processing. Transient enhanced diffusion (TED) and the high diffusion rate of boron makes it very difficult to maintain hyper-abrupt SSRW doping profiles during manufacturing. In the instant invention a thin carbon containing film is used as a diffusion barrier-capping layer over the SSRW. This capping layer can be epitaxially grown or implanted. A near intrinsic channel region can then be formed above the capping layer. Ideally this intrinsic channel region is a thin layer that is typically 50 Å to 300 Å in thickness.

Figure 1:
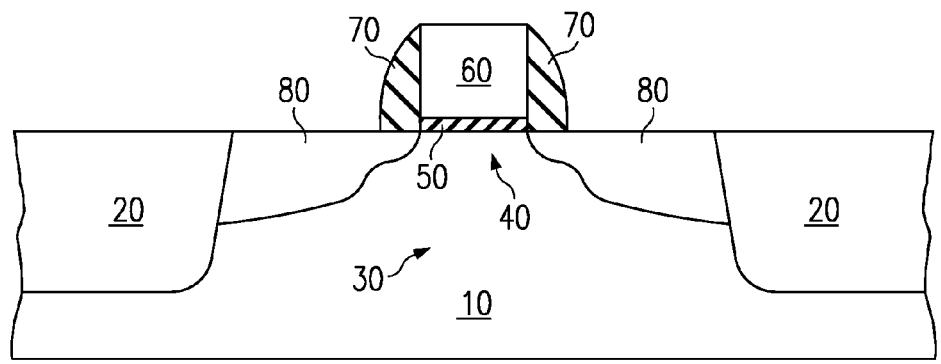
FIG. 1 is a cross-sectional diagram showing a typical MOS transistor.
Figure 2A:
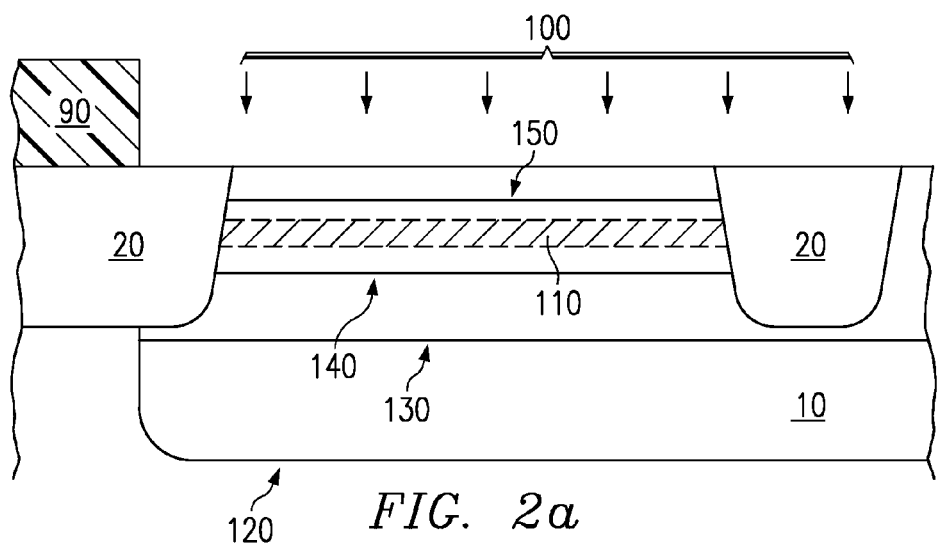
FIGS. 2A-2B are cross-sectional diagrams showing an embodiment of super steep retrograde well MOS transistor formed using ion implantation.
Figure 2B:
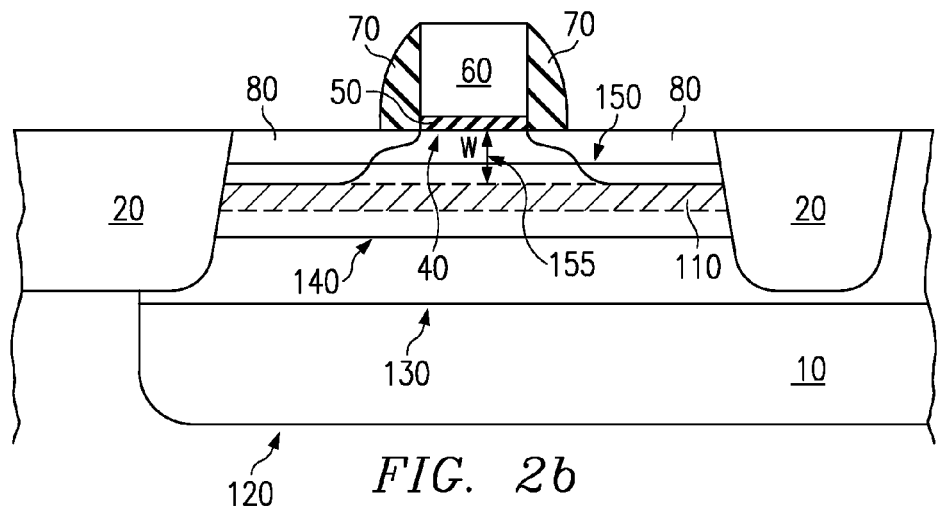

Shown in FIGS. 2(a) and 2(b) are the formation of a SSRW MOSFET using ion implantation. As shown in FIG. 2(a), a silicon substrate 10 is provided and isolation structures 20 are formed in the substrate 10. These isolation structures consist of shallow trench isolation (STI) or LOCOS. In STI, trenches are formed in the substrate 10 which are then filled with a insulating dielectric. In an embodiment of the instant invention, the dielectric that is used to fill the trench and form the isolation structure is a silicon oxide. In other embodiments silicon oxynitride or silicon nitride can also be used to form the isolation structures 20. LOCOS isolation comprises masking regions of the substrate before performing thermal oxidation to form the localized isolation structures. Following the formation of the isolation structures, a masking layer 90 is formed to selectively mask the n-well and p-well regions during either well formation process. This masking layer usually comprises photoresist. Illustrated in FIGS. 2(a) and 2(b) will be the formation of a p-well which is used in the fabrication a NMOS transistor. A similar process can be used to form a n-well by simply changing the implanted species from p-type to n-type. In forming a SSRW according to the instant invention a four implantation process will be illustrated in FIG. 2(a). The instant invention is not however limited to a four implant process. Any number of implant steps can be used to form the SSRW without exceeding the scope of the invention. In a four step process to form the p-type retrograde well four different implants of p-type dopants are performed. A deep high energy well implant is performed to form the deep p-well region 120 shown in FIG. 2(a). In an embodiment of the instant invention this well implant will comprise dopants such as boron, or a boron containing species at energies of 300-400 KeV and doses of $1\times10^{13}$-$1\times10^{14}$ cm$^{-2}$. A channel stop implant is performed to form the channel stop region 130 shown in FIG. 2(a). In an embodiment of the instant invention this channel stop implant will comprise dopants such as boron, or a boron containing species at energies of 100-200 KeV and doses of $1\times10^{12}$-$1\times10^{13}$ cm$^{-2}$. A punch through implant is performed to form the punch through region 140 illustrated in FIG. 2(a). In an embodiment of the instant invention this punch through implant will comprise dopants such as boron, or a boron containing species at energies of 50-100 KeV and doses of $1\times10^{12}$-$1\times10^{13}$ cm$^{-2}$. These three implants will form a SSRW. In addition to boron other p-type dopants such as gallium and indium could also be used to form the retrograde p-well region. To prevent the diffusion of these species into the transistor channel region a carbon capping layer is formed beneath the transistor channel region. Such a carbon capping layer 110 is shown in FIG. 2(a). In the instant case this carbon capping layer 110 is formed by implanting carbon or a carbon containing species into the substrate 10. The conditions of the carbon implant should be such that the capping layer has a carbon concentration of greater that about 0.1 atomic percent. The thickness of the capping layer should about 10-1000 angstroms and it should be positioned below the transistor channel region but above the peak of the punch through implant. A threshold implant can be performed to adjust the transistor threshold voltage by forming the dopant region 150 shown in FIG. 2(a). In an embodiment of the instant invention this threshold voltage implant will comprise dopants such as boron, or a boron containing species at energies of 5-20 KeV and doses of $1\times10^{12}$-$1\times10^{13}$ cm$^{-2}$.

Shown in FIG. 2(b) is a MOS transistor fabricated in the SSRW of FIG. 2(a). The presence of the carbon layer 110 will prevent diffusion of the boron up through the SSRW and into the channel region 40 of the transistor. In addition, if phosphorous is used in forming the source and drain regions 80 the capping layer 110 will prevent the diffusion of the phosphorous species into the well region resulting in the formation of shallow drain and source regions. The thickness of the source and drain regions will be determined by the distance W (155 in FIG. 2(b)) of the capping layer from the substrate surface under the gate dielectric layer 50. In an embodiment of the instant invention the distance W is about 50 A to 800 A. The transistor structure shown in FIG. 2(b) comprising the gate dielectric layer 50, the conductive gate layer 60, the sidewalls 70, and the source and drain regions 80 can be fabricated using standard processing techniques. The application of the instant invention to the formation of a n-well would simply involve changing the species used for the well, channel stop, punch through, and threshold voltage implants from p-type to n-type. Such n-type species could comprise arsenic, phosphorous, or antimony with energies and doses of 500-600 KeV and $1\times10^{13}$-$1\times10^{14}$ cm$^{-2}$, 300-400 KeV and $1\times10^{12}$-$1\times10^{13}$ cm$^{-2}$, 100-200 KeV and $1\times10^{12}$-$1\times10^{13}$ cm$^{-2}$, and 5-50 KeV and $1\times10^{12}$-$1\times10^{13}$ cm$^{-2}$ respectively.

Figure 3A:
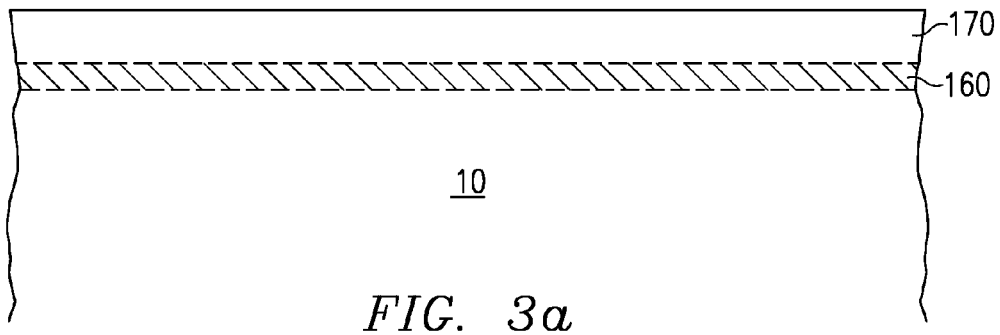
FIGS. 3A-3B are cross-sectional diagrams showing an embodiment of super steep retrograde well MOS transistor formed using epitaxial growth.
Figure 3B:
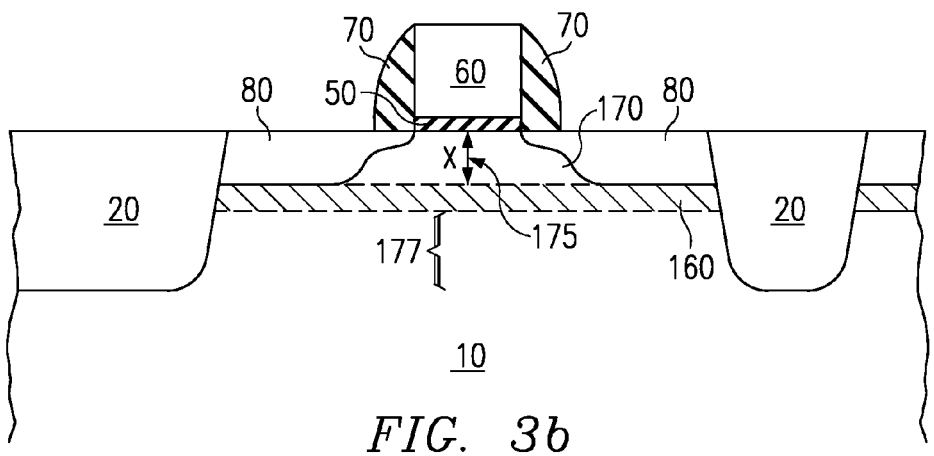

Shown in FIGS. 3(a) and 3(b) is a further embodiment of the instant invention. In this embodiment the capping layer is formed using deposition processes illustrated in FIG. 3(a). Starting with the silicon substrate 10, a carbon, carbon doped silicon layer, or a silicon-germanium-carbon (SiGeC) layer 160 is deposited on the surface of the substrate 10. The carbon concentration in the layer 160 must be greater than 0.1 atomic percent and the layer thickness should be between 10 and 1000 angstroms. Following the formation of the carbon containing layer 160, a silicon epitaxial layer 170 is formed over the carbon containing layer 160. As shown in FIG. 3(b), isolation structures 20 are formed in the structure shown in FIG. 3(a) as described above. A SSRW can be formed in the substrate 10 beneath the carbon containing layer using ion implantation. The position of such a SSRW is indicated by 177 in FIG. 3(b). The various regions formed by the ion implantation steps are omitted from the Figure for clarity. The MOS transistor is then fabricated in the silicon epitaxial layer 170 overlying the carbon containing layer 160. In addition, the depth of the source and drain regions 80 will be determined by the thickness X (175 in FIG. 3(b)) of the silicon epitaxial layer 170.

Figure 4A:
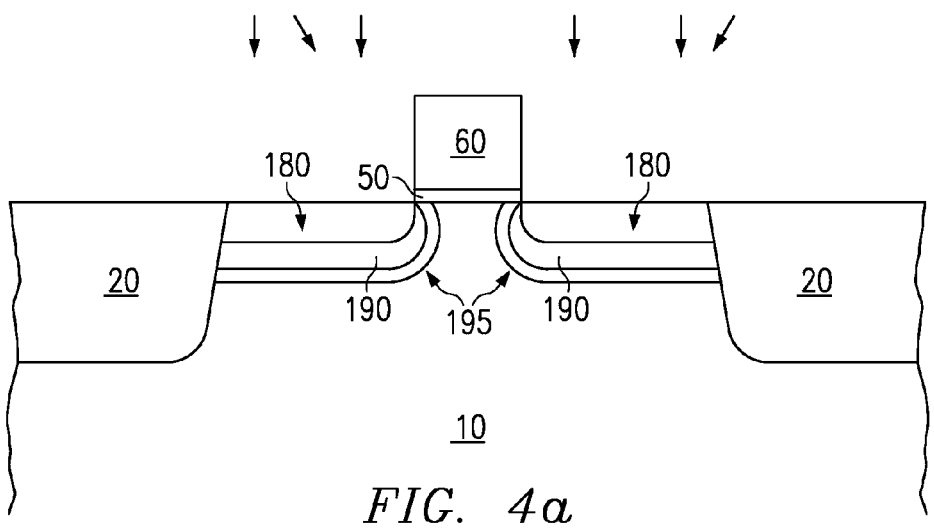
FIGS. 4A-4B are cross-sectional diagrams showing an embodiment of super steep retrograde well MOS transistor using carbon halo implants.
Figure 4B:
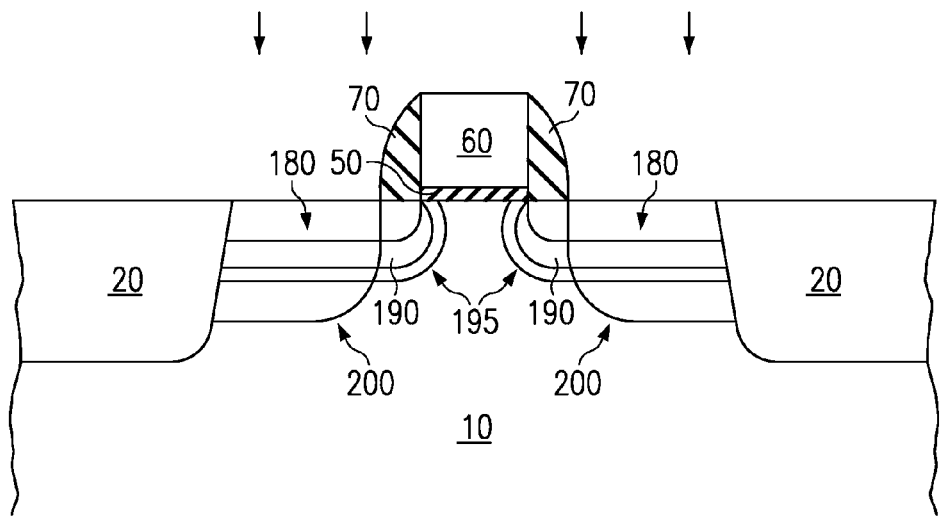

Shown in FIGS. 4(a) and 4(b) is a further embodiment of the instant invention. As shown in FIG. 4(a), isolation structures 20 are formed in a silicon substrate 10. A gate dielectric layer 50 and a conductive gate layer 60 is formed and patterned to define the gate structure (50 and 60) shown in FIG. 4(a). The lightly doped drain and source extension regions 180 are formed by performing a self-aligned implant with the gate structure (50,60). To reduce the gate length dependence of transistor threshold voltage, angled halo implants are often performed to introduce dopants under the gate structure (50, 60). In the instant invention, a layer of carbon 195 is first implanted under the gate structure followed by the normal halo implantation process which results in region 190 being formed. As shown in FIG. 4(a), the carbon containing layer 195 encapsulates the implanted halo region 190. It is required that the carbon concentration in layer 195 be greater than 0.1 atomic percent to effective inhibit dopant diffusion. For a typical NMOS transistor such a halo implantation process might be boron species implanted at energies of 5-50 KeV and doses of $1 \times 10^{12}$-$1 \times 10^{13}$ $cm^{-2}$. The carbon layer 195 will prevent the diffusion of the boron species in the halo region 190 from diffusing further under the gate. Following the formation of the halo regions 190 and the carbon regions 195, sidewall structures 70 are formed followed by the formation of the source and drain regions 200 by ion implantation. It should be noted that the structure illustrated in FIG. 4(b) can be combined with any of the SSRW schemes described above to include a carbon containing layer beneath the source drain region 200 and a SSRW beneath the carbon containing layer.

Figure 5:
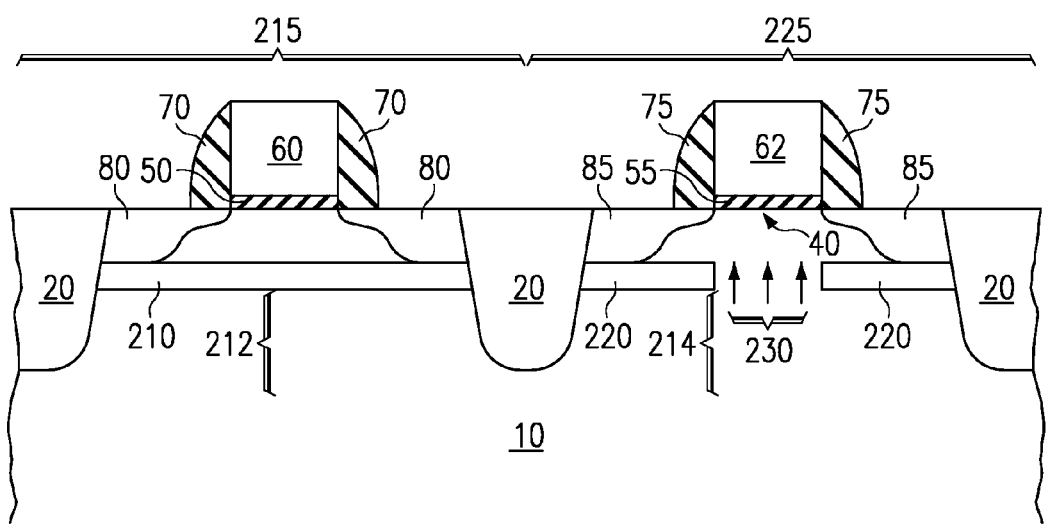
FIG. 5 is a cross-sectional diagram showing high voltage and low voltage transistors formed using an embodiment of instant invention.

Shown in FIG. 5 is a further embodiment of the instant invention. The embodiment describes the formation of a high threshold voltage device 225 and a low threshold voltage device 215. Using the methodology described above, multiple implantation processes are used to form SSRWs 212 and 214 beneath both gate dielectric layers 50 and 55. The carbon containing capping layer 210 beneath transistor 215 is contiguous while the carbon containing capping layer beneath transistor 225 is comprised of two sections 220 separated by a gap. The gap between the sections 220 is positioned beneath the conductive gate layer 62 which is formed on the gate dielectric layer 50. This allows dopant species to diffuse up through the gap 230 and increase the dopant concentration in the channel region 40 thereby increasing the threshold voltage of transistor 225. This is to be contrasted with transistor 215 where the capping layer 210 prevents the diffusion of dopant species. The threshold voltage of transistor 215 will therefore be lower than that of transistor 225 for the same ion implantation conditions. The transistors 215 and 225 will also have conductive gate layers 60 on the gate dielectric layers 50 as well as sidewall structures 70 and 75 adjacent to the conductive gate layers 60 and 62. The structure illustrated in FIG. 5 can be combined with any of the SSRW schemes described above.

Figure 6A:
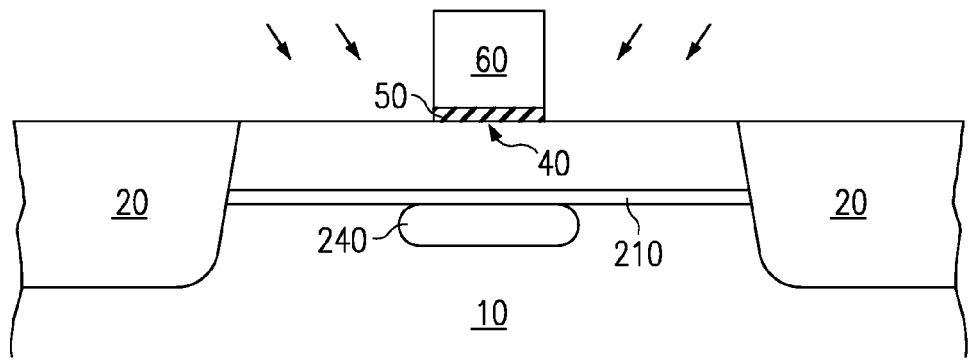
FIGS. 6A-6B are cross-sectional diagrams showing an embodiment of super steep retrograde well MOS transistor using deep carbon pocket implants.
Figure 6B:
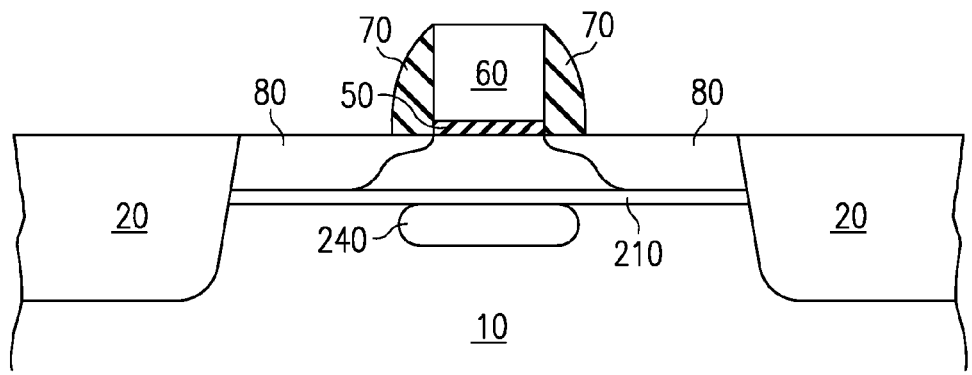

Shown in FIGS. 6(a)-6(b) is a further embodiment of the instant invention. In this embodiment a carbon containing capping layer 210 is formed using any of the methods described above. The layer 210 should have a carbon concentration that is greater than 0.1 atomic percent with a thickness between 10-1000 angstroms. After formation of the gate dielectric layer 50 and the conductive gate layer 60, deep pocket implants are performed to form the doped region 240 beneath the carbon containing capping layer 210. The presence of the carbon capping layer 210 will prevent the diffusion of the dopant species in region 240 up into the channel region 40. Following the formation of the deep pocket region 240, the sidewall structures 70, and the source and drain regions 80 are formed using standard processing techniques.

The completed transistor structure is shown in FIG. 6(b). The structure illustrated in FIG. 6(b) can be combined with any of the SSRW schemes described above.

Figure 7:
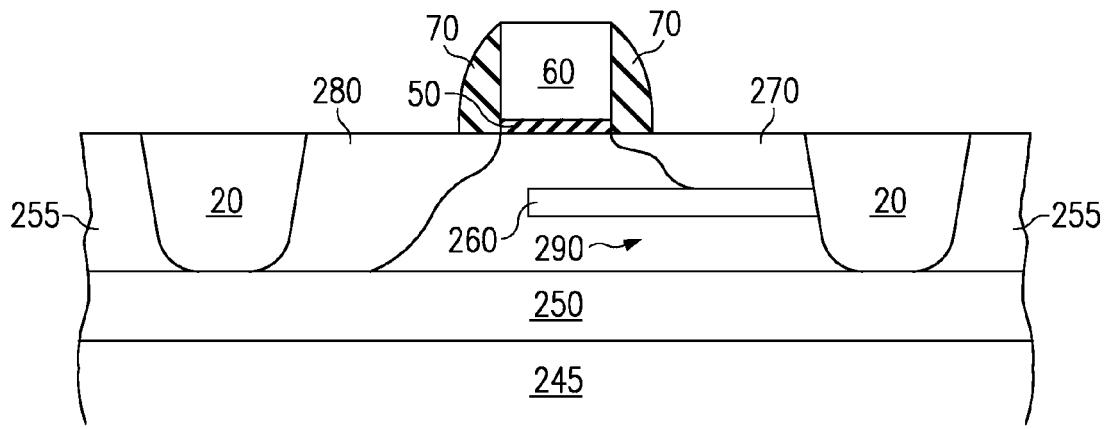
FIG. 7 is a cross-section diagram showing a further embodiment of the instant invention.

Shown in FIG. 7 is a further embodiment of the instant invention. In this embodiment a silicon on insulator (SOI) substrate is provided with a substrate 245, a buried oxide layer 250, and an upper silicon layer 255 in which the MOS transistor is formed. The isolation structures 20 are formed as described above. A carbon containing layer 260 is formed by implanting carbon or a carbon containing species asymmetrically in the source and drain regions of the MOS transistor. The layer 260 should have a carbon concentration that is greater than 0.1 atomic percent. The gate dielectric layer 50, the gate layer 60, and the sidewalls 70 are formed as described above. The asymmetric regions 270 and 280 can function as either the source or drain of the transistor. The carbon containing layer 260 will prevent the diffusion of the species used to form region 270 into region 290. Region 290 can therefore be used to provide a substrate contact for the transistor.

The methodology of the instant invention offers many advantages over existing technology. The instant invention allows for a higher thermal budget in forming the SSRW of advanced CMOS technology which increases dopant activation and hence reduces the "on state" resistance. It is now possible to simultaneously achieve ultra shallow vertical source drain junction conditions and a SSRW. Improved analog matching in individual NMOS and PMOS transistors can now be achieved since the fabrication process is now less sensitive to thermal variations during rapid thermal annealing across the wafer compared to processes that have faster diffusion rates and hence are less well controlled. The technique can be used to balance arsenic diffusion with boron diffusion for fabricating symmetric NMOS and PMOS devices in a typical CMOS process flow. It can also be used to make asymmetric source and drain structures by controlling carbon implantation in the source and drain regions. This may have benefits for making ESD and higher power devices in CMOS circuits. By using a mask to pattern the carbon (or SiGeC) implants it is possible to make a higher threshold and a low threshold voltage device while minimizing source drain implant diffusion in the vertical direction. The methodology allows boron to be extended into scaled deep submicron CMOS technologies, which have had to shift to indium dopants to achieve SSRW and ultra shallow junctions. Although indium works in these technologies it is non-standard for most CMOS processes and has a lower salability limit and is susceptible to carrier freeze out effects at room temperature which limits its usefulness. While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:
1. A method of forming a deep pocket region in a transistor, comprising:
   providing a semiconductor substrate with an upper surface;
   forming a carbon containing capping layer in the semiconductor substrate;
   forming a gate dielectric layer on the upper surface of the semiconductor substrate;
   forming a conductive gate layer on the gate dielectric layer; and forming a deep pocket region beneath the carbon containing capping layer using ion implantation; and forming source and drain regions in the semiconductor substrate, wherein the carbon containing capping layer is located below a channel region of the transistor and below the source and drain regions.

2. The method of claim 1 wherein said carbon containing capping layer has a carbon concentration of greater than 0.1 atomic percent.

3. The method of claim 1 wherein said carbon containing capping layer has a thickness between 10-1000 angstroms.

* * * * *